United States Patent
Sze

(10) Patent No.: US 9,287,313 B2
(45) Date of Patent: Mar. 15, 2016

(54) ACTIVE PIXEL SENSOR HAVING A RAISED SOURCE/DRAIN

(71) Applicant: Taiwan Semiconductor Manufacturing Co. Ltd., Hsin-Chu (TW)

(72) Inventor: Jhy-Jyi Sze, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 38 days.

(21) Appl. No.: 13/795,519

(22) Filed: Mar. 12, 2013

(65) Prior Publication Data

US 2014/0264503 A1    Sep. 18, 2014

(51) Int. Cl.
*H01L 27/146* (2006.01)

(52) U.S. Cl.
CPC .... *H01L 27/14643* (2013.01); *H01L 27/14616* (2013.01); *H01L 27/14689* (2013.01)

(58) Field of Classification Search
CPC .................. H01L 27/14643; H01L 27/146
See application file for complete search history.

(56) References Cited

U.S. PATENT DOCUMENTS

| | | | |
|---|---|---|---|
| 5,804,846 | A | 9/1998 | Fuller |
| 5,915,185 | A | 6/1999 | Fratin et al. |
| 6,150,267 | A | 11/2000 | Chen |
| 6,235,595 | B1 | 5/2001 | Sze |
| 6,303,449 | B1 | 10/2001 | Pan et al. |
| 6,566,208 | B2 | 5/2003 | Pan et al. |
| 6,606,120 | B1 | 8/2003 | Merrill et al. |
| 6,808,982 | B2* | 10/2004 | Parekh et al. ........... 438/253 |
| 6,847,051 | B2* | 1/2005 | Hong ........................ 257/59 |
| 7,348,651 | B2 | 3/2008 | Yaung |
| 7,737,479 | B2 | 6/2010 | Wen et al. |
| 7,776,676 | B2 | 8/2010 | Sze |
| 8,217,437 | B2 | 7/2012 | Hynecek |
| 2004/0033668 | A1* | 2/2004 | Cha et al. ................. 438/300 |
| 2004/0211987 | A1 | 10/2004 | Chien et al. |
| 2004/0232456 | A1 | 11/2004 | Hong |
| 2005/0158897 | A1 | 7/2005 | Sze et al. |
| 2006/0175641 | A1 | 8/2006 | Mouli |
| 2006/0192261 | A1 | 8/2006 | Sze et al. |
| 2008/0035968 | A1 | 2/2008 | Sze |
| 2008/0277710 | A1* | 11/2008 | Kim et al. ................. 257/309 |
| 2009/0162971 | A1 | 6/2009 | Sze et al. |
| 2009/0261393 | A1 | 10/2009 | Sze |
| 2012/0292664 | A1* | 11/2012 | Kanike .................... 257/192 |

FOREIGN PATENT DOCUMENTS

TW    200404371 A    3/2004
TW    200820430 A    5/2008

OTHER PUBLICATIONS

Non Final Office Action Dated Nov. 20, 2015 U.S. Appl. No. 14/833,405.

\* cited by examiner

*Primary Examiner* — Jae Lee

(74) *Attorney, Agent, or Firm* — Eschweiler & Associates, LLC

(57) ABSTRACT

An integrated circuit having an array of APS cells. Each cell in the array has at least one transistor source or drain region that is raised relative to a channel region formed in a semiconductor substrate. The raised source or drain region includes doped polysilicon deposited on the surface of the semiconductor body and a region of the body extending to the channel region that has been doped to an opposite doping type from that of the channel region by diffusion of dopants from the deposited polysilicon.

19 Claims, 8 Drawing Sheets

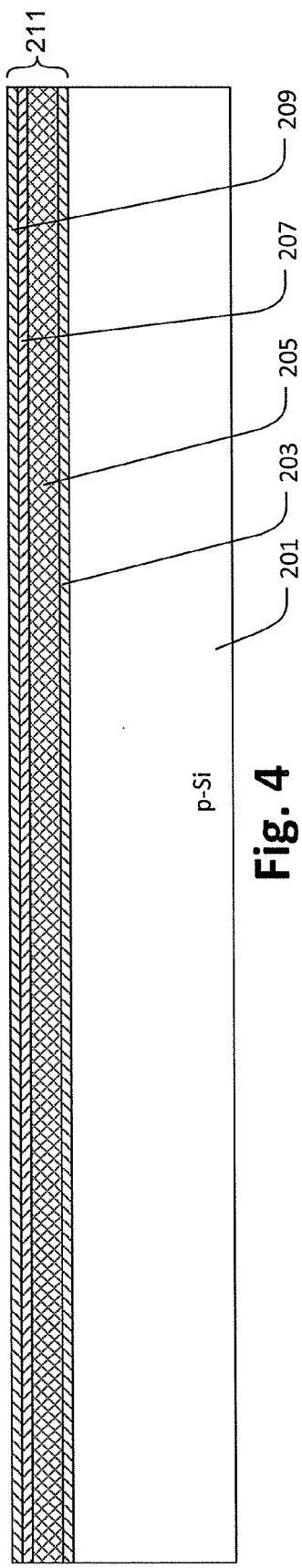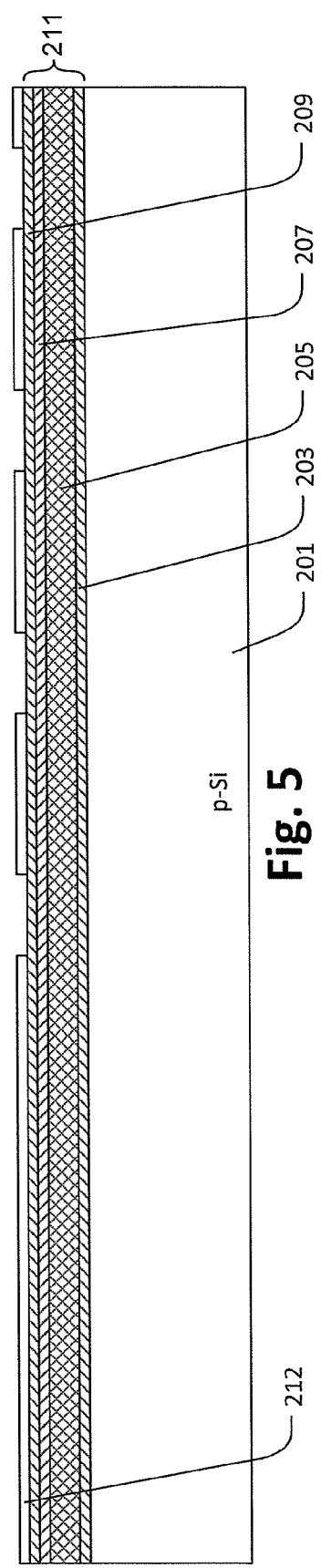

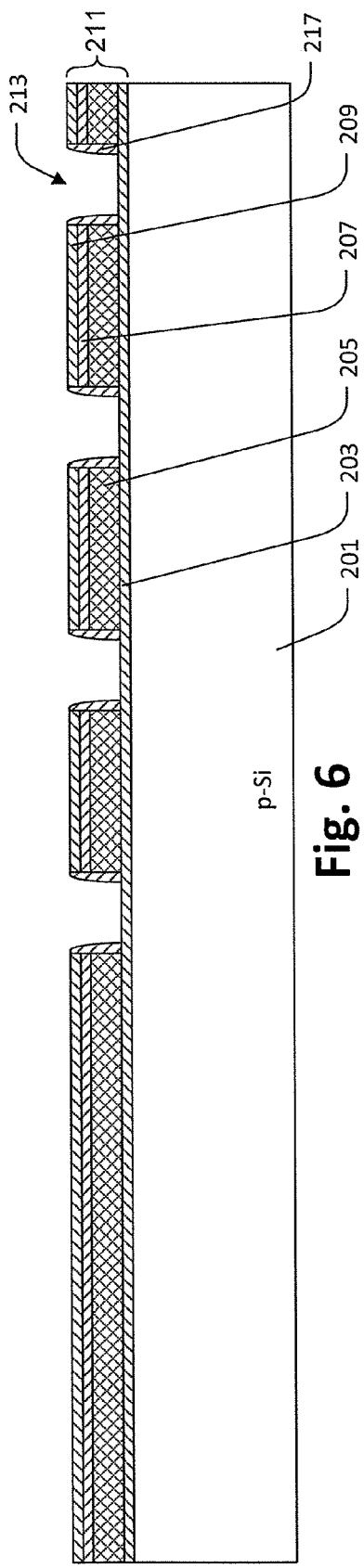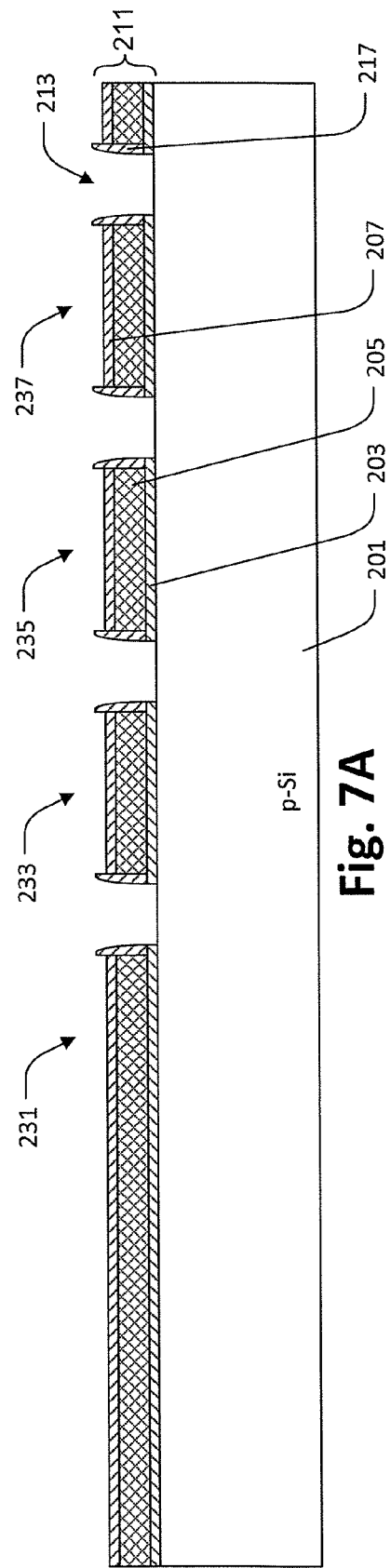

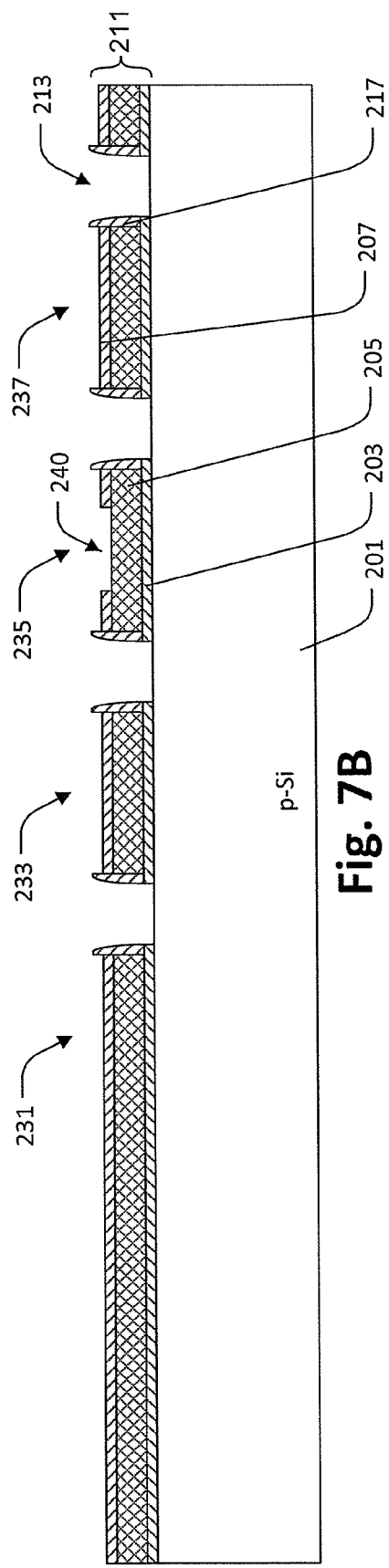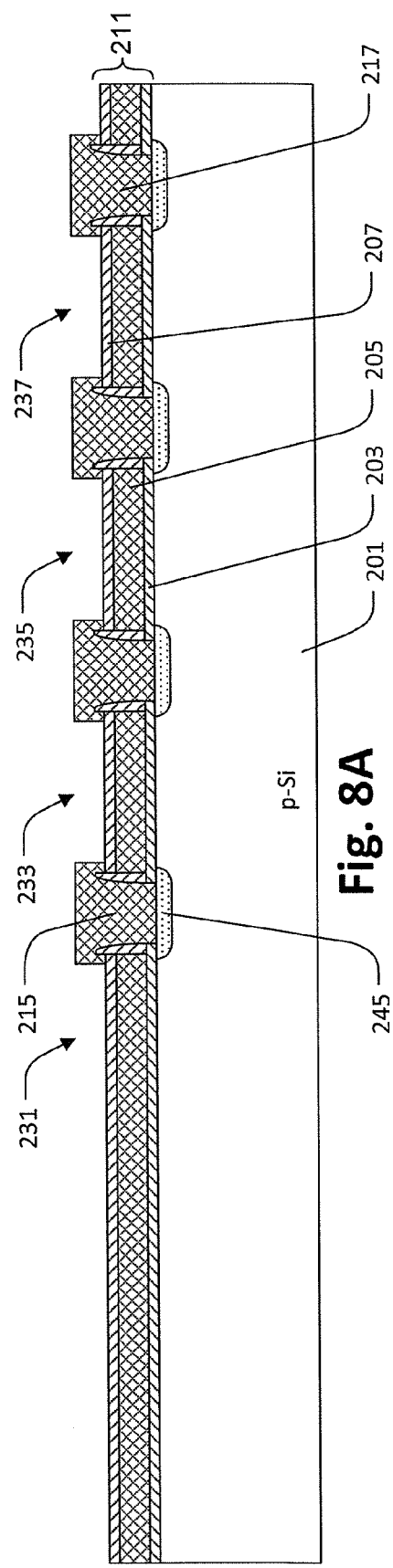

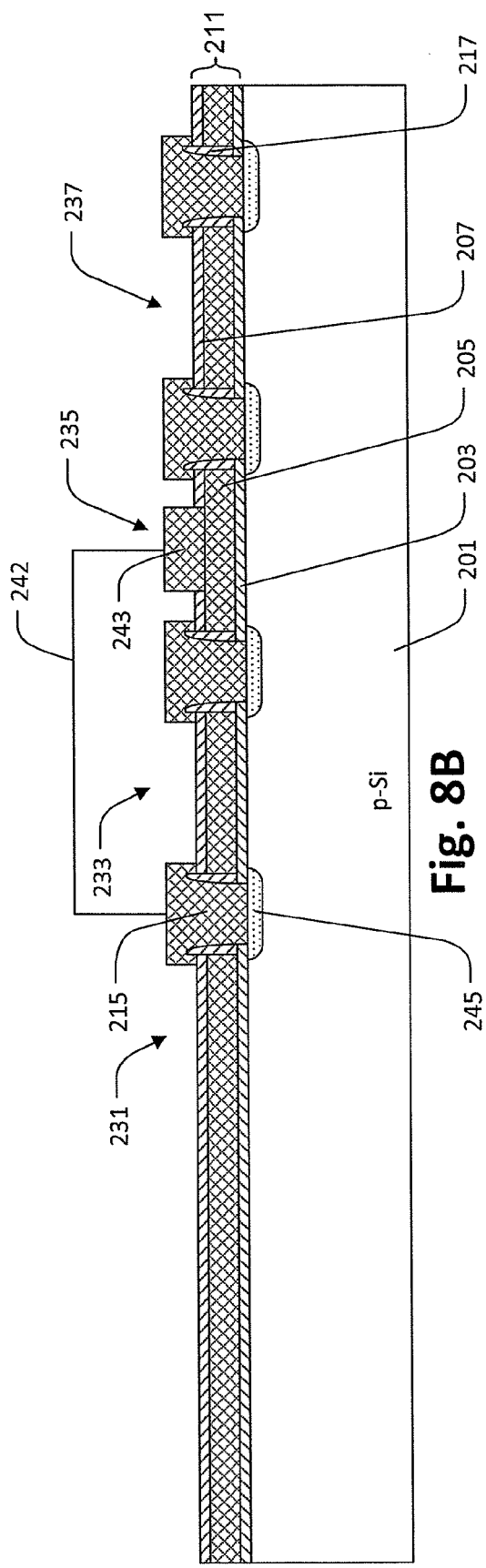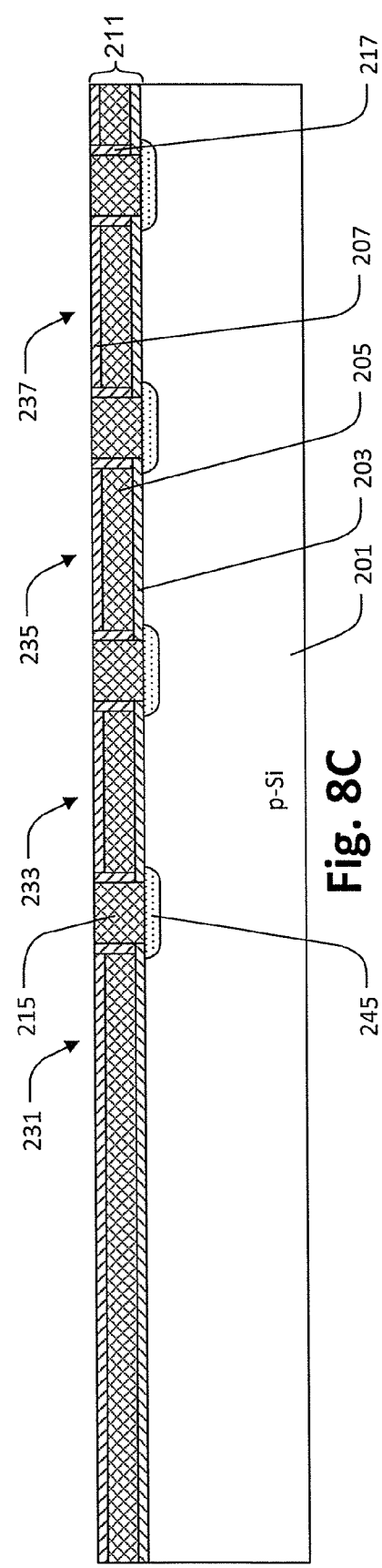

ACTIVE PIXEL SENSOR HAVING A RAISED SOURCE/DRAIN

FIELD

The present disclosure provides active pixel sensors cells for integrated circuit devices and methods for their manufacture.

BACKGROUND

Integrated circuits (IC) with image sensors are used in PC cameras and cell phones, for example. Complementary metal-oxide semiconductor (CMOS) devices have become popular IC image sensors, largely replacing charge-coupled devices (CCD). CMOS image sensors include passive pixel sensors (PPS) and active pixel sensors (APS). An APS includes at least one photodiode and an amplifier within each cell of the pixel array. The amplifier can be configured as a source follower driven by the pixel itself.

SUMMARY

The present disclosure provides an integrated circuit having an array of APS cells. Each cell in the array has at least one transistor source or drain region that is raised relative to a channel region formed in the semiconductor body. The raised source or drain region include doped polysilicon on the surface of the semiconductor body. A region of the semiconductor body that has been doped to an opposite doping type of the channel region by diffusion of dopants from the doped polysilicon extends the source or drain from the doped polysilicon to border the channel region.

The present disclosure also provides methods of forming integrated circuits having APS cells with raised source or drain regions. In these methods, a gate stack is formed over a semiconductor body. The gate stack includes a dielectric layer and a conductive layer. Openings are formed through the gate stack exposing the substrate surface underneath. The openings are then filled with doped polysilicon. Thermal annealing diffuses some of the dopants into the semiconductor body. The diffusion doped substrate and the doped polysilicon form a raised source/drain area for a least one transistor in each cell in an array of CMOS APS cells.

In one embodiment, the openings in the gate stack are formed by a dry-by-wet etch process. The dry-by-wet etch process removes the polysilicon of the gate stack by a dry etch process. The dry etch process uses the dielectric layer as an etch stop. Spacers are formed lining the sides of the opening formed by the dry etch process. A wet etch process is then used to extend the openings through the gate dielectric and expose the semiconductor body surface underneath. The spacers separate the raised source/drains from the gate electrodes.

The primary purpose of this summary has been to present certain of the inventor's concepts in a simplified form to facilitate understanding of the more detailed description that follows. This summary is not a comprehensive description of every one of the inventor's concepts or every combination of the inventor's concepts that can be considered "invention". Other concepts of the inventor will be conveyed to one of ordinary skill in the art by the following detailed description together with the drawings. The specifics disclosed herein may be generalized, narrowed, and combined in various ways with the ultimate statement of what the inventor claims as his invention being reserved for the claims that follow.

BRIEF DESCRIPTION OF THE DRAWINGS

FIGS. 4-10 illustrate an example 4T APS cell provided by the present disclosure at various stages of manufacture in accordance with one embodiment.

DETAILED DESCRIPTION

Figure 1:
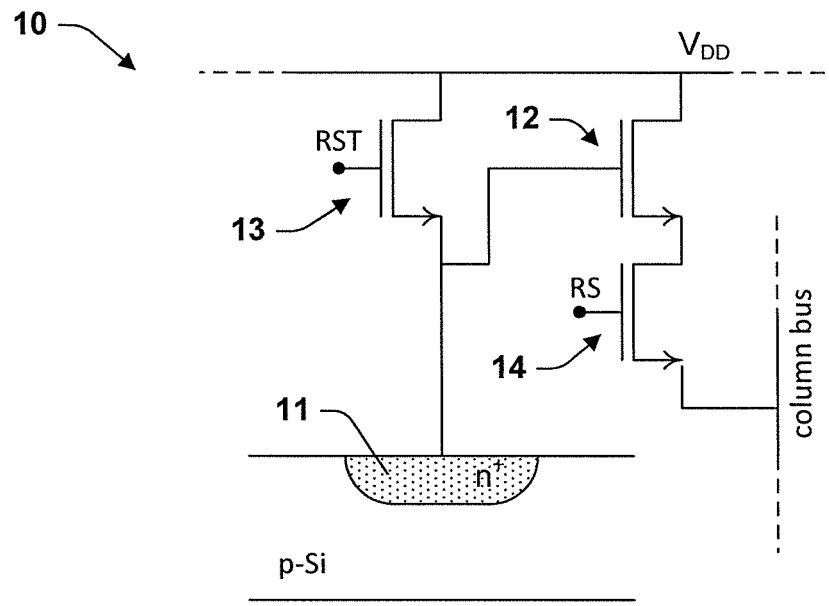
FIG. 1 is a circuit diagram for a 3T APS cell.

FIG. 1 provides a circuit diagram of an example APS cell 10 of the three transistor (3-T) variety according to one embodiment. Exposure to light causes charges to accumulate in the photodiode 11. The charge level is detected by the source follower 12. The transistor 13 is used reset the photodiode 11 between exposure periods. The row select transistor 14 is used for addressing.

Figure 2:
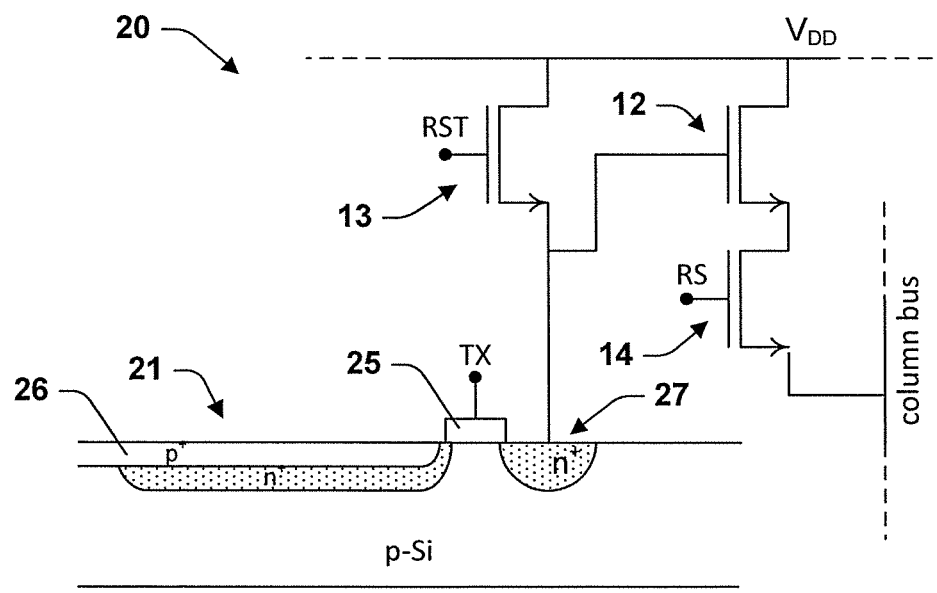
FIG. 2 is a circuit diagram for a 4T APS cell.

FIG. 2 provides a circuit diagram of an example APS cell 20 of the four transistor (4-T) variety according to one embodiment. Similar to the 3-T cell 10, the 4-T cell 20 includes a reset transistor 13 and a row select transistor 14. The 4-T cell 20 includes a pinned photodiode 21. Charge transport from the pinned photodiode 21 is initiated by pulsing a transfer gate transistor 25. The pinning implant 26 drives charge collected in the photodiode 21 to the floating node 27. The charge level in the floating node 27 is detected by the source follower 12.

Figure 3:
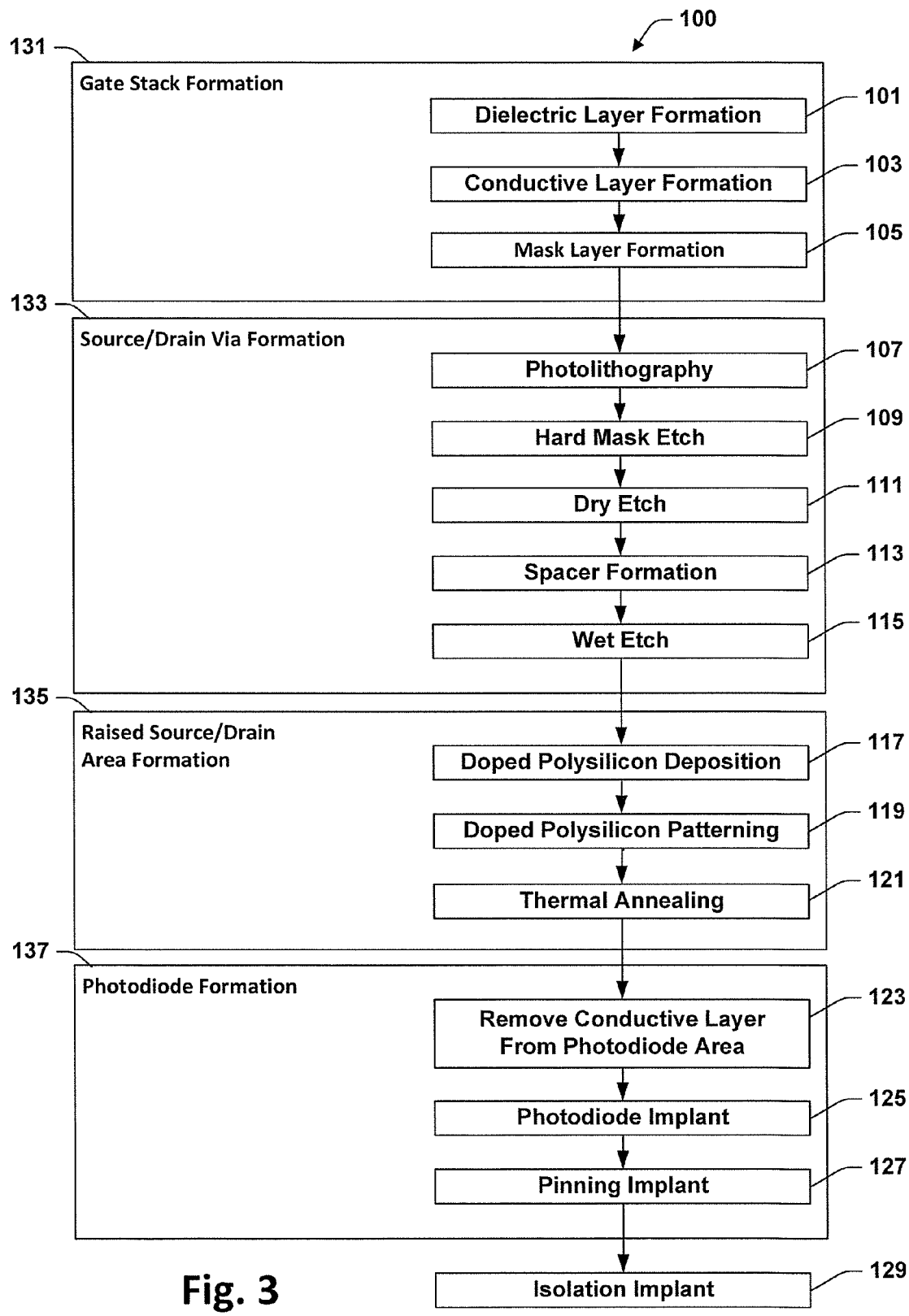
FIG. 3 is a flow chart of an example process for forming IC devices having CMOS APS cells with raised source/drain regions in accordance with one embodiment.

FIG. 3 is a flow chart of a process 100 for forming IC devices having CMOS APS cells with raised source/drain regions according to one embodiment. FIGS. 4-10 illustrate an example embodiment of this process providing an APS cell 200 of the 4T-type on a semiconductor substrate 201 according to one embodiment.

In the example embodiment, the substrate 201 is single crystal silicon lightly p-doped in the region where the APS cell 200 is formed. Instead of silicon, the semiconductor can be of another suitable type such as Ge, SiC, GaAs, GaAlAs, InP, GaN, and SiGe. In an alternate embodiment, the semiconductor substrate 201 is of the silicon-on-insulator (SOI) type.

The process 100 begins with a series of actions 131 that form a gate stack 211 on the semiconductor substrate 201 as illustrated in FIG. 4. Actions 131 include act 101, forming a dielectric layer 203, act 103, forming a conductive layer 205, and act 105, forming a hard mask layer 207 and 209.

In the example embodiment, the dielectric layer 203 is $SiO_2$. Other dielectrics can also be used. In an alternative embodiment, the dielectric is a high-k dielectric. A high-k dielectric is one having a conductivity at least 5 times that of silicon dioxide, for example. Examples of high-k dielectrics include hafnium-based materials such as $HfO_2$, HfSiO, HfSiON, HfTaO, HfTiO, HfZrO, and $HfO_2$—$Al_2O_3$ alloy. Additional examples of high-k dielectrics include, without limitation, $ZrO_2$, $Ta_2O_5$, $Al_2O_3$, $Y_2O_3$, $La_2O_3$, and $SrTiO_3$.

In the example embodiment, the conductive layer 205 is polysilicon. Other conductors can be used instead. The conductive layer 205 can also be made up of multiple layers of various materials. In an alternative embodiment, the conductive layer 205 is one or more metal layers. A metal layer 205 generally includes at least one layer of Ti, TiN, TaN, Ta, TaC, TaSiN, W, WN, MoN, and MoON. Additional examples of materials for conductive metal layers include ruthenium, palladium, platinum, cobalt, nickel, hafnium, zirconium, titanium, tantalum, aluminum, and conductive carbides, oxides, and alloys of these metals.

In the example embodiment, the hard mask layer includes two layers, a silicon nitride layer 207 and a silicon dioxide layer 209. Other hard mask materials can be used instead. There can be only one hard mask layer 207 or 209, or even no hard mask depending on the process used to pattern the gate stack 211.

The process 100 of FIG. 3 continues with a series of actions 133 that pattern the gate stack 211 forming vias 213. The first act 107 forms a patterned mask 212 over the gate stack 211 as illustrated in FIG. 5. The patterned mask 212 is formed by photolithography or any other suitable process. The pattern of the mask 212 is transferred to the hard mask (207 and 209) in act 109, and then the rest of the gate stack 211.

In one embodiment, the gate stack 211 is etched according to a dry-by-wet etch process. A dry-by-wet etch process uses a dry etch process 111 to etch through the conductive layer 205 and a wet etch process 115 to etch through the dielectric layer 203. The dry etch process 111 is selective for removing the material of the conductive layer 205, which is generally polysilicon, over material of the dielectric layer 203, which is generally silicon dioxide. The dry etch process 111 is generally a plasma etch for which the dielectric layer 203 provides an etch process. The wet etch process 115 is selective for removing material of the dielectric layer 203 in comparison to the material of the substrate 201. The dry-by-wet etch process exposes the silicon substrate 201 through the vias 213, thoroughly removing the dielectric layer 203 from those locations while minimizing penetration of the vias 213 into the substrate 201. This facilitates the formation of shallow junctions as will be discussed later.

In a more narrow embodiment, the dry-by-wet etch process includes the act 113, which is forming sidewall spacers 217 within the vias 213 as illustrated in FIG. 6. In this embodiment, the act 113 comes after the dry etch 111 but before the wet etch 115. Forming the sidewall spacers 217 includes filling the vias 213 with the spacer material 217 and then anisotropically etching to remove the spacer material 217 from all but the sidewalls of the vias 213. Forming the spacers 217 prior to the wet etch 115 allows the spacers to protect the gate stack 211 from damage during the subsequent wet etch 115.

The wet etch 115 removes the hard mask layer 209 on top of the gate stack 211 while extending vias 213 through the dielectric layer 203, producing the structure shown in FIG. 7A. Actions 133 begin to define and separate the gate electrodes for the transistors 231, 233, 235, and 237 at the locations identified in FIG. 7A. In one embodiment transistor 231 will be a transfer gate 25, transistor 233 will be a reset transistor 13, transistor 235 will be a source follower 12, and transistor 237 will be a row select transistor 14. In other embodiments, not all the transistors in such a cell need be formed by this process.

The process 100 continues with a series of actions 135 that deposit doped polysilicon to form raised source/drain areas 215 as illustrated in FIG. 8A. In one embodiment, the resultant raised source/drain areas 215 may have a dopant concentration range of about $1\times10^{19}$-$8\times10^{20}$/cm$^3$. A source/drain can be a source, a drain, or both a source and a drain. The actions 135 including act 117, depositing doped polysilicon, act 119, patterning the doped polysilicon, and act 121, thermal annealing. The doped polysilicon fills the vias 213. Its doping type is opposite that of the substrate 201 in the channel regions for the transistors 231, 233, 235, and 237. The doped polysilicon can be deposited across the entire substrate using a chemical vapor deposition (CVD) process, for example, or selectively within the vias 213 using an epitaxial growth process. After deposition, act 119 patterns the doped polysilicon using a lithographic process. In the example embodiment, patterning removes the doped polysilicon from all locations except where if forms the raised source/drain areas 215.

Thermal annealing 121 causes dopant from the doped polysilicon in the raised source/drain areas 215 to diffuse into the substrate 201 to create source/drain regions 245. In one embodiment, the dopant concentration of the resultant shallow junctions in the substrate 201 has a range of about $1\times10^{18}$-$5\times10^{20}$/cm$^3$. Diffusion reverses the doping type of the substrate 201 in region 245 and creates very shallow junctions for the transistors 231, 233, 235, and 237. The pattern of diffusion from the raised/source drain areas 215 defines the shape of the region 245, an n-doped area of substrate 201 in this example.

A raised source/drain is a transistor source/drain at least part of which is elevated with respect to the channel region or the substrate surface of the transistor. The source/drain areas illustrated by the figures include both the raised areas 215 and the substrate areas 245 that are doped n$^+$ by diffusion.

The thermal annealing 121 can be carried out at any time after act 111, depositing the doped polysilicon. In one embodiment the resultant junction depth has a range of about 50 nm to about 150 nm. The annealing should be rapid to keep the junctions very shallow in one embodiment. A very shallow junction has a depth of 100 nm or less. Shallow junctions are also facilitated by having spacers 217 be very narrow. This keeps the raised source/drain areas 215 very close to the junctions. 50 nm or less would be considered very close.

In an alternative embodiment, the doped polysilicon is patterned so that a portion 243 remains over the gate electrode of transistor 235 as show in FIG. 8B. In this alternative embodiment, a previous step etches through the mask layer 207 over the gate of transistor 235 forming an opening 240 as shown in FIG. 7B. In this way, the doped polysilicon 243 contacts the gate electrode of transistor 235. The doped polysilicon 235 is continuous with the doped polysilicon 215 of the raised source/drain shared by the transfer gate 231 and the reset transistor 233. The connection 242 is made outside the plane of FIG. 8B and becomes a buried contact line.

In another alternative embodiment act 119, patterning the doped polysilicon by a lithographic process, is replaced by chemical mechanical planarization (CMP). This removes the doped polysilicon from areas outside the vias 213 and produces the raised source/drain areas 215 as illustrated in FIG. 8C. This embodiment saves one mask in comparison to process 100. It should be understood that while the above process embodiment describes a traditional gate type process flow, alternatively, a replacement gate type process may be employed with a dummy gate that is subsequently removed and replaced with a replacement gate material, such as a metal, according to one embodiment of the disclosure.

Figure 9:
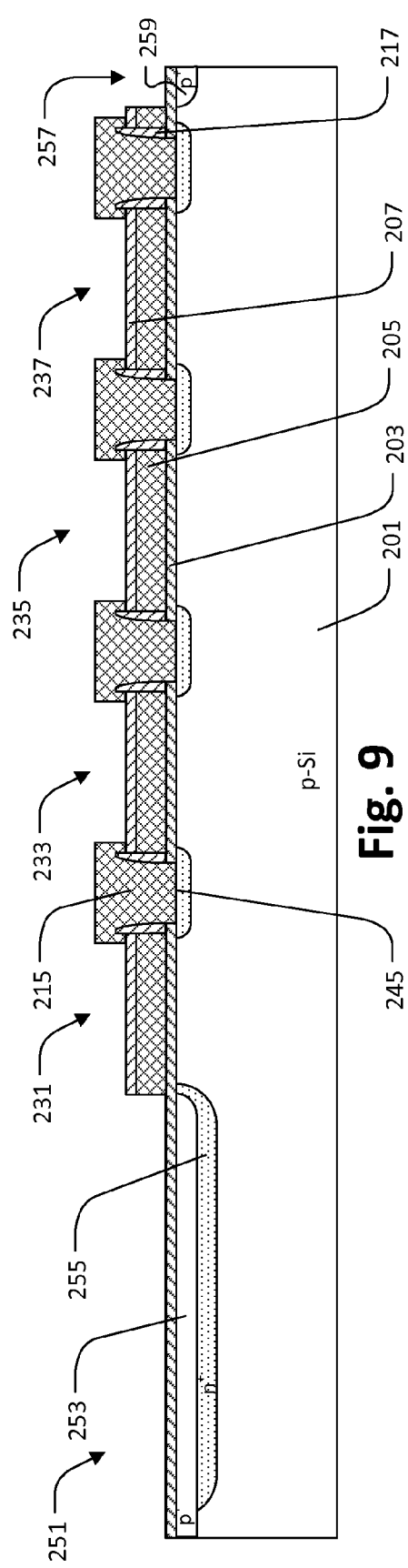

The process 100 continues with a series of actions 137 that form a photodiode 251 as illustrated by FIG. 9. The actions 137 include act 123, removing the conductive layer 205 from the photodiode area 251, act 125, forming the photodiode implant 255, and act 127, forming the pinning implant 253.

Act 123 is a lithographic process. In one embodiment, act 123 also removes the conductive layer 205 from areas 257, which are areas between cells in the photodiode array. This prepares the areas 257 to receive an isolation implant in act 129.

Act 125 reverses the doping type within the area 255 of the substrate 201 and thereby creates a p-n junction between the area 255 and the adjacent area of substrate 201. This p-n junction provides the light capturing of the photodiode 251. Act 127 is a shallower implant of a different type that again reverses the doping type with the substrate area 253.

After the photodiode is formed, the process 100 continues with act 129, forming the isolation implant 259. This is a heavy implant that is reverse in type from that of the source/drain areas 215 and provides full junction isolation. In one embodiment, this isolation implant is combined with act 127, the pinning implant, to save an action. The implants 259 isolate the cells of the photodiode array and eliminate the need for shallow trench isolation (STI) or field oxide areas in the region of the photodiode array. Accordingly, in one embodiment the array is characterized by the absence of either shallow trench isolation areas of field oxide between the cells in the array.

Figure 10:
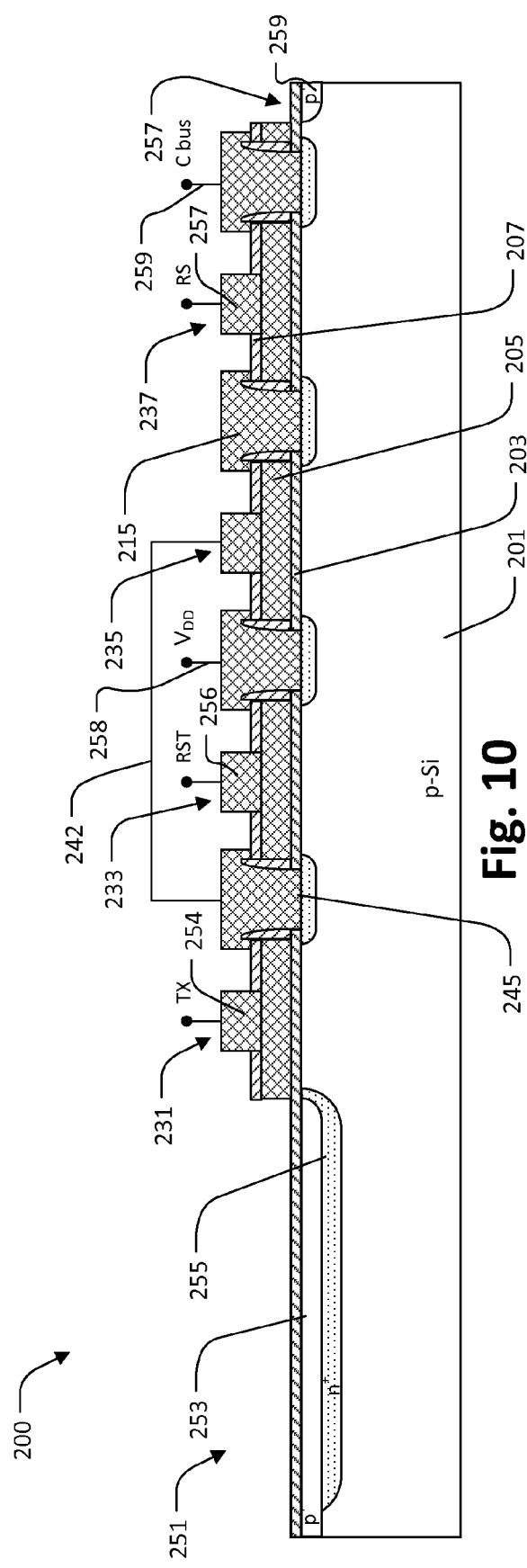

Process 100 is followed by conventional actions to form the contacts illustrated by FIG. 10 and additional process to complete formation of the integrated circuit device 200. The contacts include a gate contact 254 for actuating the transfer gate 231, a gate contact 256 for actuating the reset transistor 233, a source/drain contact 258 to connect the source/drain region 215 shared by the transistor 233 and the source follower 235 to supply voltage $V_{DD}$, a gate contact 257 for actuating the row select transistor 237, and a source/drain contact 259 to connect a source/drain region 215 of the row select transistor 237 to a column bus. Additional contacts are used to provide the connection 242 between the floating node and the gate of the source follower 235, unless this connection has already been made by a buried contact line 242 as in the embodiment of FIG. 8A. The floating node corresponds to the source/drain region 215 shared by the transfer gate 231 and the reset transistor 233.

Figure 11:
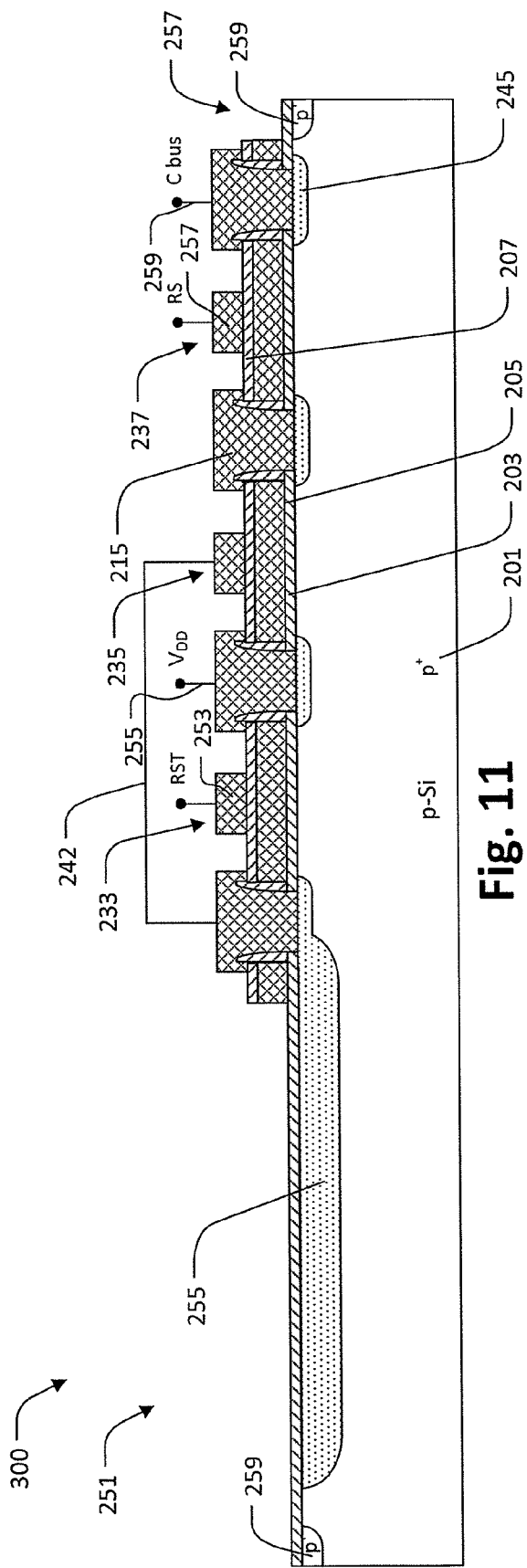
FIG. 11 illustrates an example 3T APS cell provided by the present disclosure in accordance with one embodiment.

FIG. 11 provides an example of an APS cell 300, which is similar to the APS 200 except that it is an example embodiment providing an APS cell of the 3-T type. The APS cell 300 can be produced with by the process 100 with minor modifications.

A device comprises an integrated circuit comprising an array of active pixel sensor cells formed on a semiconductor body, wherein the active pixel sensor cells each have a transistor that has a channel region and a raised source or drain region. The channel region is a doped region of the semiconductor body, and the raised source or drain region comprises doped polysilicon positioned over and in contact with the semiconductor body and a region of the semiconductor body that is doped to an opposite doping type of the channel region by diffusion of dopants into the semiconductor body from the doped polysilicon.

A method of forming an integrated circuit with an array of active pixel sensor cells comprises forming a gate stack on a doped region of a semiconductor body, wherein the gate stack comprising a dielectric layer and a conductive layer, and forming a patterned mask having openings that correspond to one or more of transistor source/drain regions for each of the active pixel sensor cells in the array. The method further includes etching openings in the gate stack through the openings in the patterned mask, forming spacers that line the sides of the openings, and filling the openings in the gate stack with polysilicon doped to an opposite doping type from the doped region of the semiconductor body. The method still further comprises performing a thermal anneal that causes dopants from the doped polysilicon to diffuse into the semiconductor substrate and reverse its doping type within a region proximate the polysilicon, wherein the region proximate the polysilicon and the and the doped polysilicon form a raised source/drain for a least one transistor in each cell of the array of complementary metal oxide active pixel sensor cells.

The present disclosure helps to overcome a heretofore design trade-off in source/drain junction depth and junction isolation size. In such instance, shallow source/drain junctions are desired, however, with source/drain silicon loss due to contact etching, such silicon loss resulted in leakage, thus requiring an increase in source/drain junction depth. By increasing source/drain junction depth, a deeper junction isolation implant is needed with sufficient width to ensure adequate device-to-device isolation, which results disadvantageously increased device area. By forming raised source/drain regions that form source/drain regions in the semiconductor body via diffusion, shallow junctions are achieved in the semiconductor body without such leakage, thereby allowing junction isolation requirements to be relaxed and thus reducing area.

In accordance with conventional solutions, leakage on the order of about 0.1 pA-1 nA existed. In accordance with various embodiments of the present disclosure, the leakage is reduced advantageously to an amount in the range of about 1 fA-tens of fA.

The disclosure as delineated by the following claims has been shown and/or described in terms of certain concepts, components, and features. While a particular component or feature may have been disclosed herein with respect to only one of several concepts or examples or in both broad and narrow terms, the components or features in their broad or narrow conceptions may be combined with one or more other components or features in their broad or narrow conceptions wherein such a combination would be recognized as logical by one of ordinary skill in the art. Also, this one specification may describe more than one invention and the following claims do not necessarily encompass every concept, aspect, embodiment, or example described herein.

The invention claimed is:

1. A device, comprising:
    an integrated circuit comprising an array of active pixel sensor cells formed on a semiconductor body;
    the active pixel sensor cells each having a transistor that has a channel region and a raised source or drain region;
    the channel region being a doped region of the semiconductor body;
    the raised source or drain region comprising doped polysilicon positioned over and in contact with the semiconductor body and a region of the semiconductor body that is doped to an opposite doping type of the channel region by diffusion of dopants into the semiconductor body from the doped polysilicon; and
    wherein the doped polysilicon of the raised source or drain region extends to overlay a gate of a source follower transistor of the active pixel sensor cells.

2. The device of claim 1, wherein the transistor is a source follower and both the source region and the drain region of the source follower are raised.

3. The device of claim 2, wherein all the transistors in each of the active pixel sensor cells have a source or drain region that is raised.

4. The device of claim 1, wherein the raised source or drain region forms a junction with the channel region that has a depth of 150 nm or less.

5. The device of claim 1 wherein doped polysilicon of the raised source or drain region is separated from the channel region by 50 nm or less.

6. The device of claim 1, wherein the active pixel sensor cells of the array are isolated from one-another by highly p-doped regions of the semiconductor body, whereby the array is characterized by an absence of either shallow trench isolation areas of field oxide between the cells in the array.

7. The device of claim 6, wherein:
the active pixel sensor cells each comprise a pinned photodiode; and
a pinning region of each photodiode and the isolation between cells are formed from one ion implantation.

8. The device of claim 1, wherein:
the active pixel sensor cells comprise pinned photodiodes and floating nodes; and
the raised source or drain regions contact one of the floating nodes in each cell.

9. The device of claim 1, wherein the raised source or drain regions is for a reset transistor and contacts a photodiode area in each active pixel sensor cell.

10. A transistor, comprising:
a gate stack comprising a dielectric layer and a conductive layer positioned over a channel region of a semiconductor body; and
a raised source or drain region disposed at a position laterally adjacent to the channel region, wherein the raised source or drain region is doped with an opposite doping type of the channel region;
a sidewall spacer located between the gate stack and the raised source or drain region, wherein the sidewall spacer has a planar upper surface that is aligned with an upper surface of a hard mask layer overlying the conductive layer; and
wherein the raised source or drain region are positioned over and in contact with an embedded source or drain region disposed within the semiconductor body.

11. The transistor of claim 10, further comprising both a raised source region and a raised drain region positioned on opposite sides of the channel region.

12. The transistor of claim 10, wherein the hard mask layer vertically disposed between the conductive layer and an overlying gate contact.

13. The transistor of claim 10, wherein the sidewall spacer extends to a position that is embedded within the raised source or drain region.

14. The transistor of claim 10, further comprising a nitride-containing hard mask layer positioned over the gate stack.

15. A transistor, comprising:
a dielectric layer positioned over a channel region of a semiconductor body;
a conductive layer positioned over the dielectric layer;
a nitride-containing hard mask layer positioned over the conductive layer;
a raised source or drain region comprising doped polysilicon positioned over and in contact with a source or drain region of the semiconductor body, wherein the doped polysilicon of the raised source or drain region extends to overlay the nitride-containing hard mask layer;
a sidewall spacer located between and in contact with both the conductive layer and the raised source or drain region; and
a polysilicon gate contact positioned over and in contact with the conductive layer.

16. The transistor of claim 15, wherein the sidewall spacer is positioned laterally adjacent to the conductive layer and on an upper surface of the dielectric layer.

17. The transistor of claim 10, further comprising:
a gate contact positioned over the conductive layer.

18. The transistor of claim 17, wherein the gate contact abuts an upper surface of the conductive layer.

19. The transistor of claim 17, wherein the gate contact comprises polysilicon.

* * * * *